United States Patent [19]
Dent

[11] Patent Number: 5,654,677
[45] Date of Patent: Aug. 5, 1997

[54] RELAXATION OSCILLATOR OF REDUCED COMPLEXITY USING CMOS EQUIVALENT OF A FOUR-LAYER DIODE

[75] Inventor: Paul W. Dent, Stehag, Sweden

[73] Assignee: Ericsson Inc., Research Triangle Park, N.C.

[21] Appl. No.: 668,815

[22] Filed: Jun. 24, 1996

[51] Int. Cl.$^6$ ............................ H03B 5/24; H03C 3/00
[52] U.S. Cl. .................. 331/111; 331/108 A; 331/143; 331/177 R; 332/135; 455/113; 455/129
[58] Field of Search ................... 331/108 A, 111, 331/143, 150, 177 R, 185; 332/117, 135; 455/110, 113, 129

[56] References Cited

U.S. PATENT DOCUMENTS

| | | | |
|---|---|---|---|
| 3,311,111 | 3/1967 | Bowers | 331/108 A |
| 3,701,051 | 10/1972 | Simms | 331/108 A X |
| 3,731,201 | 5/1973 | Frisbie | 325/105 |
| 3,829,799 | 8/1974 | Miyata et al. | 331/108 A X |
| 3,878,482 | 4/1975 | Schowe, Jr. | 331/108 D |
| 4,015,146 | 3/1977 | Aihara et al. | 307/304 |
| 4,219,787 | 8/1980 | Schade, Jr. | 331/111 |
| 4,260,959 | 4/1981 | Allgood | 331/111 |
| 4,260,960 | 4/1981 | Isham et al. | 331/111 |
| 4,267,527 | 5/1981 | Petrizio et al. | 331/111 |
| 4,491,807 | 1/1985 | Hoover | 331/111 |
| 5,185,584 | 2/1993 | Takeuchi | 331/25 |
| 5,302,920 | 4/1994 | Bitting | 331/45 |
| 5,327,106 | 7/1994 | Sanders | 331/109 |
| 5,418,751 | 5/1995 | Kaiser | 365/211 |

OTHER PUBLICATIONS

*IEEE Transactions on Circuits and Systems*, vol. cas–32, No. 1, Jan. 1985, New York, US, pp. 46–61, XP002024214, L. Chua et al., "Bipolar–JFET–MOSFET Negative Resistance Devices".

*Patent Abstracts of Japan*, vol. 010, No. 065 (E–388), 14 Mar. 1986 & JP–60–214628–A (Tokie Asou), 26 Oct. 1985.

*RCA Review*, vol. 39, No. 2, Jun. 1978, Princeton, U.S., pp. 250–273, XP002024215, O. Schade, "Advances in BiMOS Integrated Circuits".

*Primary Examiner*—David Mis
*Attorney, Agent, or Firm*—Nixon & Vanderhye P.C.

[57] ABSTRACT

A relaxation oscillator of reduced complexity is described which can be constructed as part of a silicon integrated circuit. The current controlled oscillator includes complementary field effect transistors operating in enhancement mode. The drain of one FET is connected to the gate of the other FET and vice versa. The resulting CMOS circuit functions as a four-layer diode. A resistor is connected between the drains of both transistors. A storage capacitor is connected between the sources of both transistors. A current source is connected to charge the storage capacitor such that the frequency of an oscillator output signal is determined by the current generated by the current source.

14 Claims, 3 Drawing Sheets

U.S. Patent     Aug. 5, 1997     Sheet 1 of 3     5,654,677
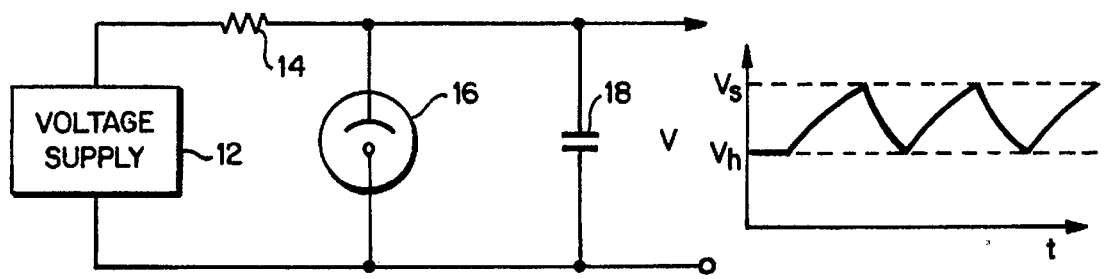
FIG. 1 PRIOR ART
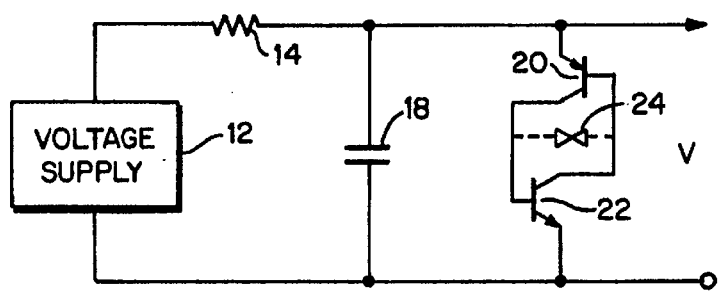
FIG. 2
FIG. 3
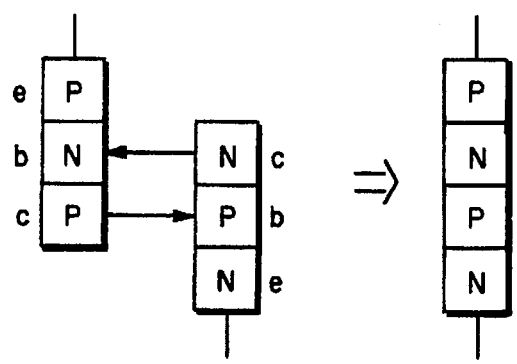

RELAXATION OSCILLATOR OF REDUCED COMPLEXITY USING CMOS EQUIVALENT OF A FOUR-LAYER DIODE

The present invention relates to relaxation oscillators, and more particularly, to a complementary metal oxide silicon (CMOS) integrated circuit for implementing a current-controlled oscillator of reduced complexity. One application of such a current-controlled oscillator is in the conversion of audio signals detected by a microphone to frequency modulated signals for transmission via radio frequency transmitter.

BACKGROUND AND SUMMARY OF THE INVENTION

A relaxation oscillator is one in which one or more voltages or currents change suddenly at least once during each cycle. The oscillator circuit is arranged so that during each cycle, energy is stored in and then discharged from a reactive element such as a capacitor or an inductor. The charging and discharging processes occupy different time intervals. Such a relaxation oscillator has an asymmetrical output waveform rather than a sinusoidal waveform, e.g., a sawtooth type waveform. Common types of relaxation oscillators include multi-vibrator and uni-junction transistor oscillators.

One of the oldest relaxation oscillators uses a neon tube as $V_s$ of neon tube 16, the neon tube 16 abruptly begins to conduct, and in shown in FIG. 1. Current from a supply 10 flows through resistor 14 to charge capacitor 18. When capacitor 18 reaches a striking voltage the process, discharges the capacitor 18. When the capacitor discharges through the holding voltage $V_h$ of the neon tube 16, the neon tube 16 ceases to conduct. As a result, capacitor 18 resumes charging. The overall result is the sawtooth type waveform which oscillates between $V_s$ and $V_h$.

A bipolar junction transistors-based relaxation oscillator may be constructed using bipolar junction transistors rather than a neon tube. An PNP bipolar junction transistor 20 may be connected "back-to-back" with an NPN bipolar junction transistor 22. More specifically, the base of transistor 20 is connected to the collector of transistor 22, and the base of transistor 22 is connected to the collector of transistor 20. Preferably, the collector-to-base junction of one of these transistors 20 and 22 has a well-defined reversed breakdown voltage such as is exhibited by a Zener diode. Below the Zener breakdown voltage, the collector-base junction is reverse-biased and therefore does not conduct. Above the Zener breakdown voltage, the junction is forward-biased and supports relatively high currents. The Zener diode alone, however, cannot produce a relaxation oscillation because it does not exhibit hysteresis.

Nonetheless, the circuit of FIG. 2 does exhibit some hysteresis. The voltage across the collector-base junction of the PNP transistor may be represented by an intrinsic Zener diode 24. When that collector-base junction voltage is less than a forward bias voltage, transistor 20 is basically non-conducting exhibiting only a small leakage current from the collector of PNP transistor 20 to the base of NPN transistor 22. Similarly, NPN transistor 22 passes only a small collector leakage current to the base of PNP transistor 20. At low currents, the gain of transistors 20 and 22 is less than unity so that the leakage currents are not magnified. Essentially, the transistors can be viewed as a very high impedance, e.g., essentially nonconducting. As the voltage V across the transistors increases as capacitor 18 charges from voltage supply 12 through resistor 14, the leakage currents increase quite sharply when the Zener or breakdown voltage is reached. At such higher currents, transistor gain is larger than unity. Consequently, the collector current of transistor 22 flowing into the base of transistor 20 is amplified thereby increasing the drive of transistor 20 resulting in a collector current larger than that of transistor 22. This larger collector current flows into the base of transistor 22 and is also amplified ultimately driving transistor 22 harder. Those increasing currents essentially "snowball" so that a relatively high current flows through the transistors to rapidly discharge capacitor 12. This current is initiated by the onset of Zener breakdown and is maintained during discharge by the current amplification which together produce large hysteresis.

When capacitor 12 is sufficiently discharged, (i.e., the value of V has decreased), to a point where the current flow through transistors 20 and 22 returns to the level where their respective gains are less than unity, the snowball effect ceases. The transistors return to the almost nonconducting, low leakage current state allowing capacitor 18 to recharge. The cycle of charge, discharge, and recharge generates an oscillating voltage output V.

FIG. 3 shows how a PNP bipolar junction transistor and an NPN bipolar junction transistor can be merged when the collector of each transistor is connected to the base of the other transistor to form a four-layer PNPN diode. Such four layer structures are often accidentally formed when making CMOS integrated circuits and are considered undesirable because they result in the so-called "substrate latch-up" problem. As a result, steps are usually taken in CMOS production processes to avoid the formation of accidental four layer diodes. Another significant problem associated with such four layer devices is the difficulty of controlling their characteristics. In other words, the breakdown voltage at which the four-layer diode conducts depends very much on independent hard-to-control variables such as temperature and doping content of the semiconductor material which are hard to produce consistently. Therefore, it is difficult to predict and control the output characteristics of an oscillator formed using this type of PNPN diode structure.

It is therefore an object of the present invention to provide an equivalent of a four-layer PNPN diode device which can be readily controlled in a CMOS type configuration. In particular, it is an object of the present invention to construct such a device to function as a simple, current-controlled oscillator.

The present invention provides an electric oscillator of reduced complexity which is also suitable for construction on a silicon integrated circuit. A P-channel field effect transistor (FET) operated in an enhancement mode includes source, drain, and gate electrodes. An N-channel field effect transistor (FET) operated in an enhancement mode is connected to the P-channel field effect transistor in complementary fashion in a complementary metal oxide silicon (CMOS) circuit. More specifically, the drain electrode of the P-channel FET is connected to the gate electrode of the N-channel FET, and the drain electrode of the N-channel FET is connected to the gate electrode of the P-channel FET. A first capacitor is connected across the P-channel and N-channel FETs such that the capacitor is repetitively charged and discharged through the CMOS circuit in response to a current generated by a current source.

The current generated by the current source charges the capacitor up to a striking voltage at which the P-channel and N-channel FETs conduct current to discharge the capacitor down to a holding voltage at which the P-channel and N-channel FET cease conducting current. In essence, the current generated by the current source controls the frequency of the output signal generated by the oscillator.

A resistor is connected between the drain electrodes of the P-channel and N-channel FETs. A second capacitor is connected between the drain electrodes of the P-channel and N-channel FETs in shunt across the resistor. The resistor provides a voltage drop across the gate and drain electrodes of both FETs such that threshold voltage is sufficient to cause the complementary FETs to conduct when the capacitor is charged to the striking voltage. Conversely, the resistor ensures that the voltages applied to the gate of both transistors are less than their respective threshold turn-on voltages when the oscillator output voltage reaches its holding value. The shunt capacitor maintains a smooth transition between conduction and non-conduction for the FETs.

The current-controlled relaxation oscillator in accordance with the present invention includes a complementary metal oxide silicon (CMOS) circuit equivalent in function to a four-layer junction diode having three P-N junctions. The CMOS circuit is connected to positive and negative terminals of a voltage supply and to the storage capacitor. The current source is connected to the negative terminal of the voltage supply and to ground. The current generated by the current source charges and discharges the capacitor to control frequency that depends on the current source current such that the voltage output of the oscillator oscillates between a striking voltage at the control frequency. As a result, the present invention provides an easily manufactured and controlled four-layer junction diode suitable for low cost, real world applications.

One application of the present invention is to radio communications. The radio includes a microphone for detecting an acoustic signal, a reduced complexity current controlled oscillator connected to the microphone for generating an oscillator output signal representing the acoustic signal, and a radio transmitter for transmitting over an antenna of radio output signal based on the oscillator output signal. A digital frequency modulation discriminator may be connected to the oscillator for generating a sample of digital representation of an instantaneous frequency of the oscillator output signal, thus providing a simple technique for digitizing an audio signal.

BRIEF DESCRIPTION OF THE DRAWING

FIG. 1 is a relaxation oscillator circuit using a neon tube;

FIG. 2 is a relaxation oscillator circuit using back-to-back connected bipolar junction transistors;

FIG. 3 illustrates how a PNP and an NPN junction transistor can merge in semiconductor fabrication to form a four-layer PNPN diode;

DETAILED DESCRIPTION OF THE PREFERRED EMBODIMENTS

In the following description, for purposes of explanation and not limitation, specific details are set forth, such as particular circuits, circuit components, etc. in order to provide a thorough understanding of the present invention. However, it will be apparent to one skilled in the art that the present invention may be practiced in other embodiments and in other ways that depart from these specific, illustrative details. In other instances, detailed descriptions of well known methods, devices, and circuits are omitted so as not to obscure the description of the present invention with unnecessary detail. Although the present invention is described with reference to relaxation oscillator circuitry, it should be understood that the present invention is not limited to this particular application.

Figure 4:
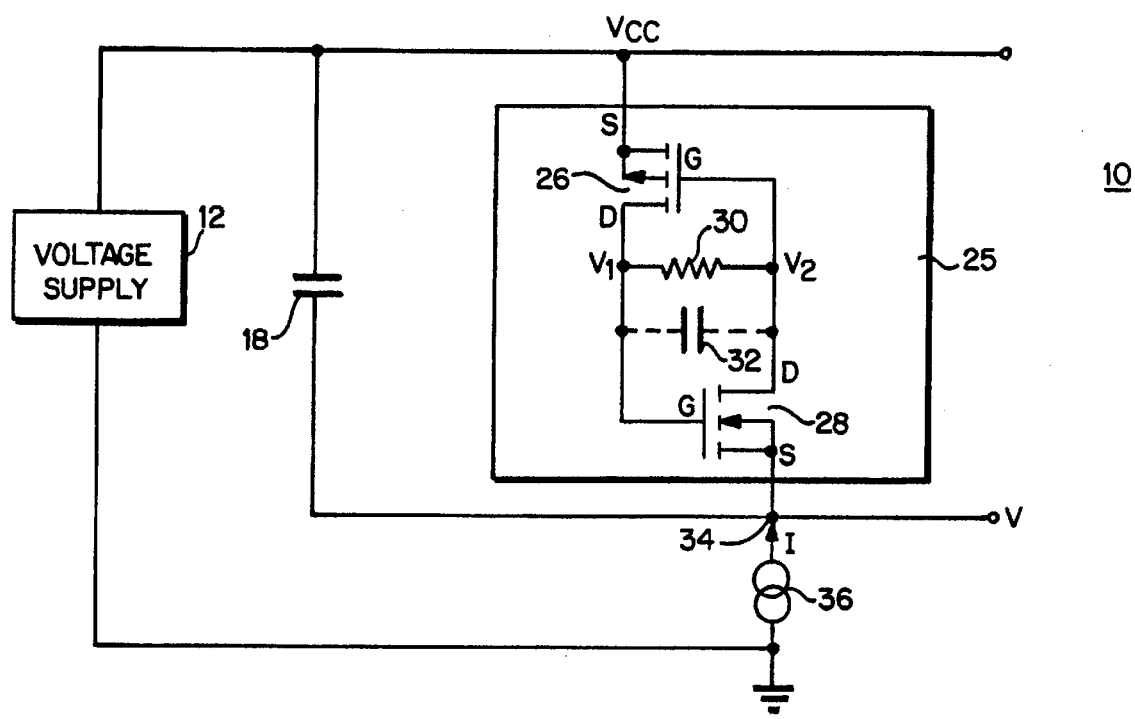
FIG. 4 is an example of a relaxation type oscillator circuit using CMOS field effect transistors operated in enhancement mode in accordance with the present invention.

FIG. 4 shows an oscillator circuit 10 which employs a CMOS equivalent of a four-layer diode indicated by function block 25 in accordance with the present invention. A voltage ($V_{cc}$) supply 12 is connected to a capacitor 18 and to the CMOS four-layer diode 25 through a current source 36 at node 34 to ground. The voltage V at node 34 depends on the state of the CMOS four-layer diode.

The CMOS four-layer diode equivalent circuitry in function block 25 includes a P-type, enhancement mode, field effect transistor (FET) 26 connected to an N-type, enhancement mode, field effect transistor (FET) 28. The source of transistor 26 is connected to one terminal of capacitor 18 to voltage supply 12. The drain of transistor 26 is connected to the gate of transistor 28, and the gate of transistor 26 is connected to the drain of transistor 28. The source of transistor 28 is connected to node 34 as is the other terminal of capacitor 18. A resistor 30 is connected between the gates/drains of transistors 26 and 28 and defines node voltages $V_1$ and $V_2$. An optional capacitor 26 may also be connected across the gates/drains of transistors 26 and 28 in parallel with resistor 30. Resistor 30 is the mechanism by which CMOS circuit 25 provides oscillatory conduction through circuit 25. In functional terms, the voltage drop across resistor 30 provides node voltages $V_1$ and $V_2$ whose values determine whether the FETs 26 and 28 conduct or do not conduct. More specifically, resistor 30 ensures that FETs 26 and 28 either both conduct or both do not conduct.

The value of resistor 30 "R" is chosen in relation to the maximum value of the current I from current source 36 so that the voltage drop IR, when both transistors are assumed fully conducting, does not provide sufficient gate-drain bias to maintain both transistors 26 and 28 in a conducting state. Thus, the circuit does not exhibit a static stable state with the current I flowing through transistors 26 and 28 and resistor 30. On the other hand, the circuit can exhibit a transient state in which a current greater than I flows through transistors 26 and 28 and resistor 30, the extra current being drawn temporarily from capacitor 18, thus discharging it. This higher current causes an IR drop across resistor 30 which biases transistors 26 and 28 sufficiently to maintain conduction, at least until capacitor 18 is discharged and can then supply no more extra current. At that point, the current can be no more than supplied by the current source 36, which, by appropriate choice of R as explained above, cannot maintain conduction. Thus, transistor 26 and 28 cease to conduct, and the current source current I must now flow to capacitor 18, commencing a recharge cycle.

When capacitor 18 recharges so that ($V_{cc}$–V), i.e., the voltage across the transistor pair is greater than the sum of their gate threshold voltages, the transistors conduct and the discharge cycle repeats. The repetition frequency of the charge-discharge cycle is determined by the current source current magnitude, the capacitor 18 value, and the threshold voltages of transistors 26 and 28. The two-terminal circuit 25 comprised of components 26, 28, and 30 exhibits a "striking voltage" at which conduction abruptly increases, and a "holding current" below which conduction abruptly decreases, thus emulating the characteristics of a 4-layer diode. Further detailed description of the circuit operation is provided below.

As long as there is no current flowing through resistor 30, the gates/drains of transistors 26 and 28 are at the same potential, i.e., $V_1 = V_2$. If the gate-to-source voltages of the FET transistors 26 and 28 are below their respective threshold voltages, the FET transistors pass only a very small leakage current. To distinguish between the threshold voltages of the P-type and N-type devices, the threshold voltage of the P-type FET 26 is denoted by $V_p$, and the threshold of the N-type FET 28 is denoted by $V_n$. As long as the voltage across the source-to-gate junction of the P-type FET is less than its threshold voltage $V_p$, transistor 26 will not conduct. Similarly, so long as the voltage across the gate to source junction of the N-type FET is less than its threshold voltage $V_n$, the transistor 28 will not conduct.

Described mathematically, if $$V_{cc} - V_2 < V_p \qquad (1),$$

transistor 26 does not conduct. As long as $$V_1 - V < V_n \qquad (2),$$

transistor 28 will not conduct. Since current is substantially zero when the transistors are not conducting, $V_1 = V_2$. As a result, these equations (1) and (2) can be combined to generate the inequality which defines the condition for non-conduction for circuit 25. However, if $$V_{cc} - V > V_p + V_n \qquad (4),$$

both transistors 26 and 28 conduct, and current flows through the drain of transistor 26, resistor 30, and the drain of transistor 28 to its source. When $V_{cc} - V > V_p + V_n$, the voltages $V_1$ and $V_2$ cannot find a settling point that satisfies either of the inequalities $V_{cc} - V2 < V_p$ or $V1 - V < V_n$. Rather, these node voltages $V_1$ and $V_2$ settle only at a point where both $V_{cc} - V_2 > V_p$ and $V_1 - V > V_n$ are true, thus permitting current to flow freely through CMOS circuit 25.

The voltage across resistor 30 resulting from the current flow through the transistors 26 and 28 increases voltage $V_1$ thereby increasing the difference $V_1 - V$, which has the effect of applying a larger gate voltage to transistor 28 for greater current conduction through transistor 28. More current through resistor 30 drops a larger voltage across resistor 30 thereby reducing the node voltage $V_2$. A smaller $V_2$ increases the voltage difference $V_{cc} - V_2$ applied to the gate of transistor 26 causing transistor 26 to conduct more freely. The result is a "snowball effect." As transistors 26 and 28 conduct more freely, greater current flows through resistor 30 which causes even greater current flow through the transistors. In the ideal situation, the node voltage $V_1$ becomes equal to $V_{cc}$, and node voltage $V_2$ becomes equal to V with the transistor current flowing through resistor 30 being $(V_{cc} - V)/R30$. By choosing the value of resistor 30 so that the current through the transistors is greater than the current I generated by the current source 36, capacitor 18 is discharged.

When the voltage across the two transistors 26 and 28 ($V_{cc} - V$) decreases to less than $V_p$ or less than $V_n$, one of the transistors 26 or 28 ceases to conduct because its gate-to-source voltage is then less than the threshold voltage necessary for conduction. Accordingly, current flow through resistor 30 decreases causing voltage $V_1$ to reduce and $V_2$ to increase, which further reduces the gate-to-source voltages of transistors 26 and 28. The net result is that the two transistors abruptly cease conducting which allows the capacitor 18 to resume being charged by control current I from current source 36.

Figure 5:
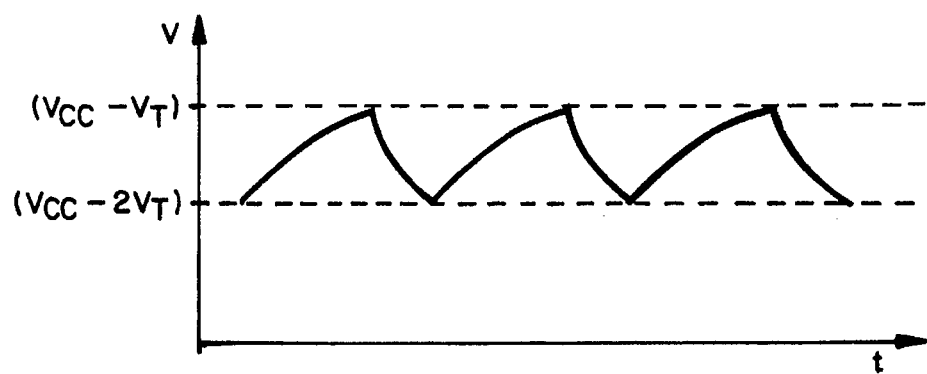
FIG. 5 is a graph illustrating a striking voltage and a holding voltage between which the output signal of the relaxation oscillator circuit shown in FIG. 4 oscillates.

As shown in FIG. 5, the voltage V exhibits a relaxation oscillation between a striking voltage $(V_{cc} - 2V_T)$ where $2V_T$ is the sum of the p-type and n-type threshold voltages, and a quenching voltage $(V_{cc} - V_T)$ where $V_T$ is either the p-type or n-type threshold. This provides the hysteresis needed for oscillation. The frequency of oscillation is controlled by the speed at which the control current I recharges the capacitor 18. In essence, changing the control current modulates the frequency of oscillation such that the output of the oscillator circuit is a frequency modulated signal at node 34. The greater the control current I from current source 36, the faster the capacitor 18 recharges, and therefore, the higher the frequency of the oscillator output. Alternatively, a lower value of I means that the capacitor charges more slowly, and the oscillator output signal has a lower frequency. Such current control of the oscillator makes for a simple but effective frequency modulator.

In addition to the above described advantages of the relaxation oscillator in accordance with the present invention, the silicon area needed for the oscillator is very small. Moreover, the oscillator needs only one timing capacitor and may also operate at very low currents, e.g., 100 µA.

An optional capacitor 32 is preferably included to assist in maintaining a smooth transition from non-conducting to conducting states of circuit 25; otherwise, that transition would be determined by noise. Specifically, if transistor 26 suddenly tries to begin conducting as a result of noise, voltage V1 is increased towards $V_{cc}$ and capacitor 32 ensures that the gate of transistor 26 also moves instantaneously in the same direction thereby counteracting the tendency of transistor 26 to conduct. In similar fashion, capacitor 32 also prevents premature conduction of transistor 28. In essence then, capacitor 32 functions as a negative feedback for instantaneous changes caused by independent noise in each transistor, and ensures that conduction occurs (as a result of the transistor threshold voltages being exceeded) for more than an instant.

Figure 6:
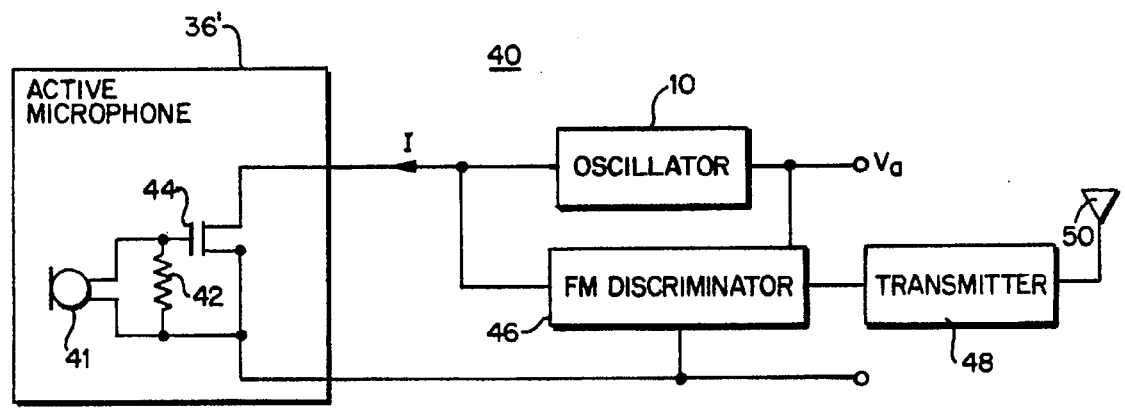
FIG. 6 is a diagram of a radio transmitter employing at the circuit illustrated in FIG. 4 as one example application of the present invention.

FIG. 6 shows one example application of the oscillator 10 shown in FIG. 4. FIG. 6 illustrates the transmit portion of a radio 40. The current control source is an active microphone 36' which includes a piezo-electric microphone transducer 41 connected to an open drain FET pre-amplifier 44. A large resistor 42 ensures a large input impedance for pre-amplifier 44. The active microphone 36' is connected to oscillator 10 with the output of the oscillator 10 being fed to a digital FM discriminator circuit 46 which produces a sampled, digital representation of the oscillator's instantaneous frequency, and therefore a digital representation of the microphone signal. An AFC feedback may also be provided from the discriminator to maintain the mean oscillator frequency in a desired range. The digital output can then be sent to a conventional digital radio transmitter 48 such as a digital radio, (e.g., a digital cellular phone), for transmission via antenna 50.

Figure 7:
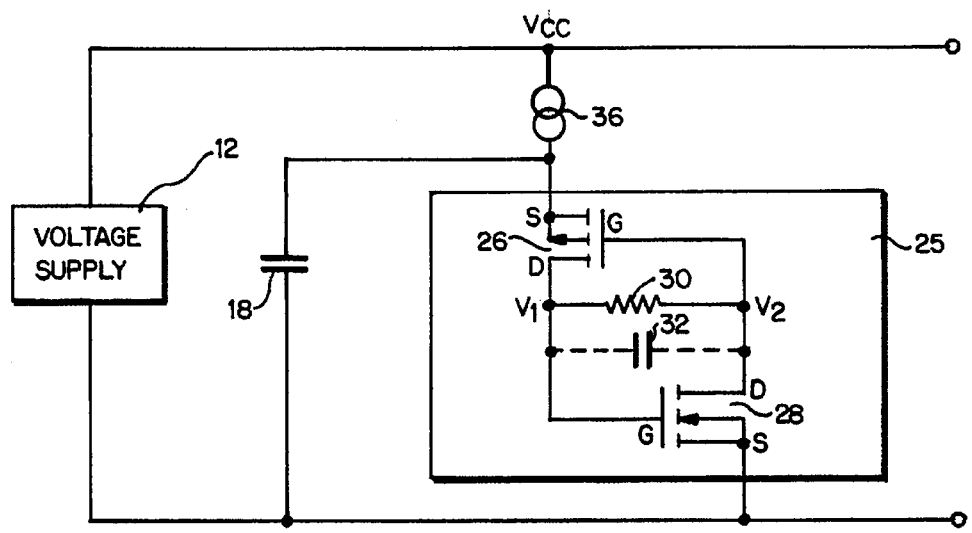
FIG. 7 is an alternate example of a relaxation type oscillator circuit using CMOS field effect transistors operated in enhancement mode in accordance with the present invention.

The circuit of FIG. 4 is illustrated with current source 36 connected between the source of FET 28 and the voltage supply negative (ground). It could also be constructed with the current source 36 between FET 26 source and the supply positive terminal ($V_{cc}$), in which case capacitor 18 and FET 28 source would be connected to ground as shown in FIG. 7. The configuration of FIG. 7 may be preferable when the CMOS process is better able to fabricate capacitors with one terminal grounded, and the configuration of FIG. 4 may be used when one capacitor terminal is preferably connected to $V_{cc}$. The present invention is thus adapted for efficient and flexible fabrication in different CMOS processes.

Another advantage of the invention is that the oscillator can operate at low frequencies using very little power simply by reducing the current source I (I being the mean current consumption) to as low as desired. Low-current, low-frequency oscillators are useful in many applications such as to define the standby cycles in radio telephones and pagers to extend battery life. The oscillator drives a counterchain programmed to power up the radio telephone or pager receive circuitry, including a more accurate crystal oscillator when a terminal count is reached. During the power-on period, the oscillator's frequency in the present invention may be accurately measured using the more accurate crystal oscillator as a reference, and the terminal count adjusted to provide a given delay for the next power-up period. In this way, production tolerances or other uncertainties in the frequency of the fully-integrated oscillator may be "self-calibrated."

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An electrical oscillator, comprising:
   an P-channel field effect transistor (FET) operating in an enhancement mode including source, drain, and gate electrodes;
   an N-channel field effect transistor (FET) operating in enhancement mode including source, drain, and gate electrodes, wherein the drain electrode of the P-channel FET is connected to the gate electrode of the N-channel FET and the drain electrode of the N-channel FET is connected to the gate electrode of the P-channel FET;
   an impedance connected between the drain electrodes of the P-channel and N-channel FETs;
   a first capacitor connected between the source electrodes of the P-channel and N-channel FETs; and
   a current source connected to charge the capacitor.

2. The oscillator of claim 1, wherein current generated by the current source charges the capacitor up to a striking voltage at which the P-channel and N-channel FETs conduct current through the impedance to discharge the capacitor down to a holding voltage at which the P-channel and N-channel FETs cease conducting current.

3. The oscillator of claim 1, wherein current generated by the current source controls a frequency of an output signal generated by the oscillator.

4. The oscillator of claim 1, wherein the oscillator is constructed on a silicon integrated circuit.

5. The oscillator of claim 1, wherein the impedance includes a resistor connected in shunt with a second capacitor between the drain electrodes of the P-channel and N-channel FETs.

6. The oscillator of claim 1, further comprising:
   a voltage supply connected at one terminal with the first capacitor and the N-channel and P-channel FETs connected in series with the current source to ground and at another terminal to ground.

7. The oscillator in claim 1, wherein the current source corresponds to an acoustic signal detected by a microphone and the oscillator output signal is modulated in frequency in accordance with the detected acoustic signal.

8. A radio for conducting communications over a radio channel, comprising:
   a microphone for detecting an acoustic signal and generating a corresponding electrical current;
   a current-controlled oscillator of reduced complexity responsive to the electrical current for generating an oscillator output signal representing the acoustic signal; and
   a transmitter for transmitting over an antenna a radio output signal based on the oscillator output signal,
   wherein the oscillator includes:
   a complementary metal oxide silicon (CMOS) circuit with a P-channel field effect transistor (FET) operating in an enhancement mode connected to an N-channel field effect transistor (FET) operating in enhancement mode so that the drain electrode of the P-channel FET is connected to a gate of the N-channel FET and a drain of the N-channel FET is connected to a gate of the P-channel FET, and
   a first capacitor connecting the P-channel and N-channel FETs such that the oscillator is repetitively charged and discharged through the CMOS circuit in response to the detected acoustic signal.

9. The radio in claim 8, further comprising:
   a digital frequency modulation discriminator connected to the oscillator for generating a sampled digital representation of an instantaneous frequency of the oscillator output signal and thereby a sampled digital representation of the acoustic signal.

10. The radio in claim 8, further comprising:
    a resistor connected between the drain electrodes of the P-channel and N-channel FETs.

11. The radio in claim 10, further comprising:
    a second capacitor connected between the drains of the P-channel and N-channel FETs in shunt across the resistor.

12. A current-controlled, relaxation oscillator, comprising:
    a voltage supply having positive and negative terminals;
    a complementary metal-oxide-silicon (CMOS) circuit having a pair of terminals and a shunt capacitor across said terminals; and
    a current source having a pair of terminals through which a controlled current may flow;
    wherein the voltage supply, CMOS circuit, and current source are connected in series in a loop such that current flow through the current source charges and discharges the shunt capacitor at controlled intervals that depend on the controlled current source current such that a Voltage output of the oscillator oscillates between a striking voltage and a quenching voltage at a controlled frequency.

13. The relaxation oscillator of claim 12, wherein striking and holding oscillator voltages are determined by threshold voltage conditions for required for complementary MOS transistors included in the CMOS circuit to conduct.

14. The relaxation oscillator of claim 12, wherein the CMOS circuit includes:
    a P-channel field effect transistor (FET) operating in an enhancement mode including source, drain, and gate electrodes;
    an N-channel field effect transistor (FET) operating in enhancement mode including source, drain, and gate electrodes, wherein the drain electrode of the P-channel FET is connected to the gate electrode of the N-channel FET and the drain electrode of the N-channel FET is connected to the gate electrode of the P-channel FET; and a resistor connected between the drain electrodes of the P-channel and N-channel FETs for controlling current flow through the P-channel and N-channel FETs.

* * * * *